United States Patent [19]

Nakano

[11] Patent Number: 4,902,646

[45] Date of Patent: Feb. 20, 1990

[54] MESFET PROCESS EMPLOYING DUMMY ELECTRODES AND RESIST REFLOW

[75] Inventor: Hirofumi Nakano, Itami, Japan

[73] Assignee: Mitsubishi Denki Kabushiki Kaisha, Japan

[21] Appl. No.: 276,484

[22] Filed: Nov. 28, 1988

[30] Foreign Application Priority Data

May 13, 1988 [JP] Japan .................. 63-117778

[51] Int. Cl.$^4$ .................. H01L 21/283; H01L 21/312
[52] U.S. Cl. .................. 437/203; 437/912; 437/982; 437/944; 437/41; 437/175; 437/229; 437/39; 148/DIG. 111
[58] Field of Search .................. 437/40, 41, 175, 176, 437/177, 178, 179, 44, 912, 982, 39, 184, 203, 944, 228, 249; 148/DIG. 111; 357/22, 23.3

[56] References Cited

U.S. PATENT DOCUMENTS

| | | | |
|---|---|---|---|
| 4,503,599 | 3/1985 | Ueyanagi et al. | 437/177 |
| 4,569,119 | 2/1986 | Terada et al. | 357/22 |
| 4,670,090 | 6/1987 | Sheng et al. | 437/249 |
| 4,728,621 | 3/1988 | Graf et al. | 437/41 |
| 4,745,082 | 5/1988 | Kwok | 437/39 |

FOREIGN PATENT DOCUMENTS

| | | |
|---|---|---|
| 60-120574 | 6/1985 | Japan . |
| 1087569 | 10/1967 | United Kingdom . |
| 2054265 | 2/1981 | United Kingdom . |
| 2064868 | 6/1981 | United Kingdom . |
| 2143372 | 2/1985 | United Kingdom . |
| 0266522 | 5/1988 | United Kingdom . |

OTHER PUBLICATIONS

Weitzel, C. E., et al., *Journal of Electrochemical Society*, vol. 133, No. 10, Oct. 1986, pp. 409C–416C.
Yamasaki, K., et al., *IEEE Trans. Electron Devices*, vol. ED-29, No. 11, Nov. 1982, pp. 1772–1777.
Terada et al, "Self-Aligned Pt-Buried . . . for GaAs LSI", IEEE, GaAs IC Symposium, 1983, pp. 138–141.

*Primary Examiner*—Brian E. Hearn
*Assistant Examiner*—T. N. Quach
*Attorney, Agent, or Firm*—Leydig, Voit & Mayer

[57] ABSTRACT

A production method for a semiconductor device (e.g. MESFET) includes a metal pattern production process for producing a plurality of metal patterns e.g. gate, source, drain electrodes on a semiconductor substrate having an active layer. The metal pattern production process includes disposing dummy metal patterns (2a/2b) of silicon nitride at a plurality of metal pattern production regions on the semiconductor substrate using a resist mask (3), disposing a resist pattern (4) on the entire surface of the substrate with gaps between the metal pattern production regions, filling the gaps between said dummy metal patterns and the resist pattern with resist by reflowing the resist pattern (4), removing the dummy metal patterns (2a), depositing a metal layer over the entire surface of the partially completed device, and lifting off unwanted metal to produce a desired metal pattern of source/drain electrodes (5). The second and subsequent steps for replacing the dummy metal pattern with the metal pattern are repeated using another resist pattern (6) to form gate electrode (7).

6 Claims, 3 Drawing Sheets

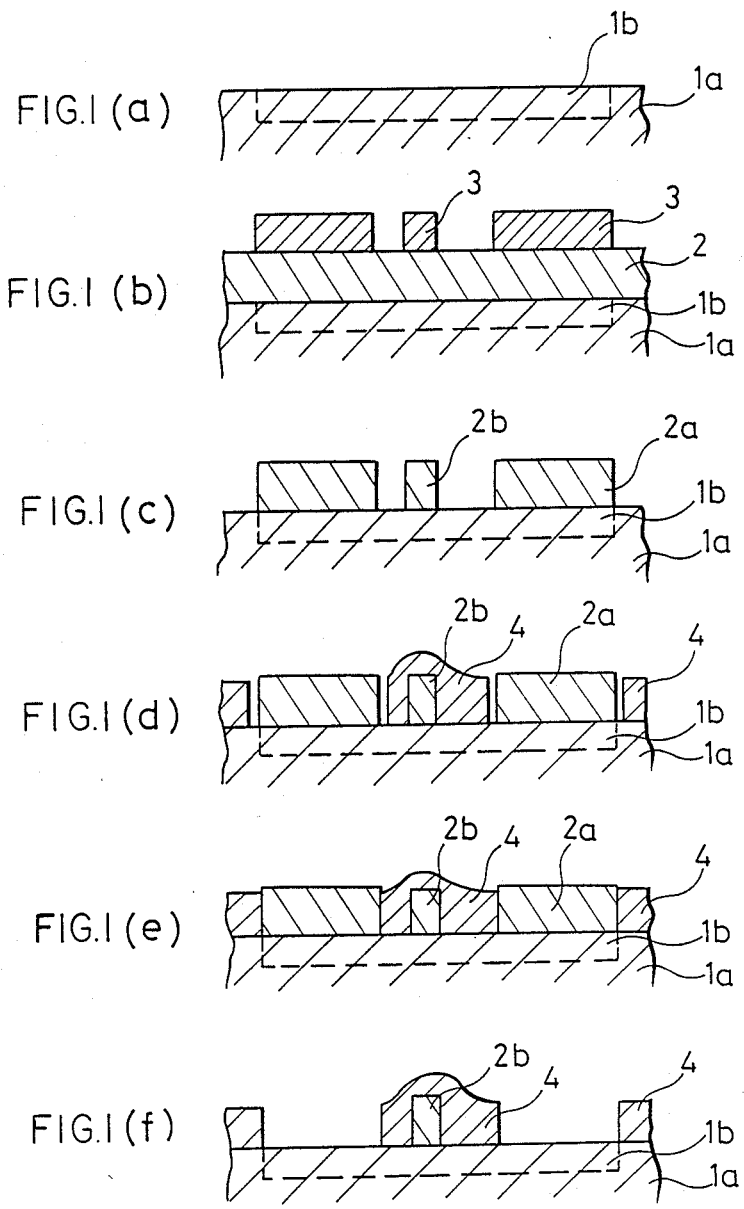

MESFET PROCESS EMPLOYING DUMMY ELECTRODES AND RESIST REFLOW

FIELD OF THE INVENTION

The present invention relates to a production method for semiconductor device, and more particularly to a method capable of producing source/drain and gate electrodes without variations in distances therebetween.

BACKGROUND OF THE INVENTION

FIG. 2 shows a production method for semiconductor device according to the prior art.

In FIG. 2, a region of a semiconductor substrate 1a is activated by ion implantation thereby to produce an active layer 1b. Photoresist pattern 4 is deposited on the semiconductor substrate 1a including the active layer 1b, as a mask for producing source/drain electrodes. Source and drain electrodes 5 are deposited on the active layer 1b. Photoresist pattern 6 is deposited thereon, as a mask for producing a gate electrode. A gate electrode 7 is deposited at a position between the source and drain electrodes 5.

An aluminum electrode, titanium-gold laminated electrode, titanium-molybdenum-gold laminated electrode or the like are used for the gate electrode 7 and nickel metal, gold-germanium alloy or the like are used for the source/drain electrodes. Because the materials for the source/drain electrodes and that for the gate electrode are different from each other, it is impossible to form these electrodes with a single mask.

Accordingly, production of electrodes in the prior art method is conducted in separate processes using different masks as described in the following.

First of all, a region of the semiconductor substrate 1a is activated by ion implantation thereby to produce an active layer 1b (FIG. 2(a)). Resist pattern 4 which has apertures at the source/drain electrode regions is deposited thereon (FIG. 2(b)). Next, the source and drain metal is evaporated and lifted off to produce source/drain electrodes 5 (FIG. 2(c)).

Next, resist pattern 6 for producing a gate electrode is deposited thereon and an aperture is opened at desired position by mask alignment (FIG. 2(d)). Thereafter, a recess is formed in substrate 1a in the aperture portion. Gate metal is evaporated and deposited over the entire surface of partially completed device. The gate metal on resist 6 is lifted off, thereby to produce the gate electrode 7 (FIG. 2(e)).

In this prior art production method for semiconductor device, since resist is patterned by mask alignment when producing a gate electrode, the distances between source/drain electrodes and the gate electrode vary within a substrate or over a number of substrates due to mask alignment error. These distance variations result in variations in the characteristics of the field effect transistor produced.

SUMMARY OF THE INVENTION

It is an object of the present invention to provide a production method for a semiconductor device capable of producing source/drain and gate electrodes without variations in the distances therebetween.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, dummy patterns of source/drain and gate electrodes are produced by using a mask at regions which respectively correspond to the source/drain and gate electrodes, and thereafter they are replaced by the source/drain and gate electrodes. Accordingly, the positions of respective electrodes are determined by a mask and positional deviations due to mask alignment error are gone. Therefore, source/drain and gate electrodes are produced without variations in the distances therebetween.

DETAILED DESCRIPTION OF THE PREFERRED EMBODIMENTS

An embodiment of the present invention will be described with reference to FIG. 1.

Figure 1:
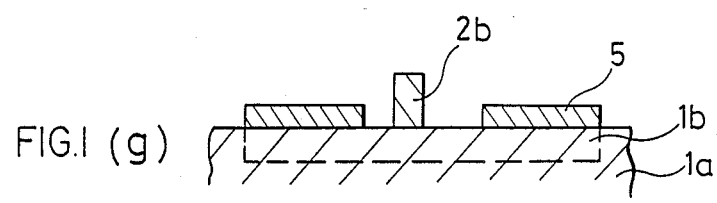
FIGS. 1(a)–1(k) are diagrams illustrating the steps in a method for producing a semiconductor device according to the present invention.
Figure 1:
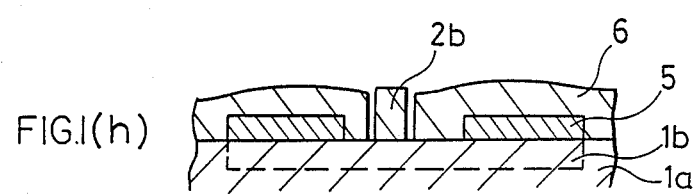
Figure 1:
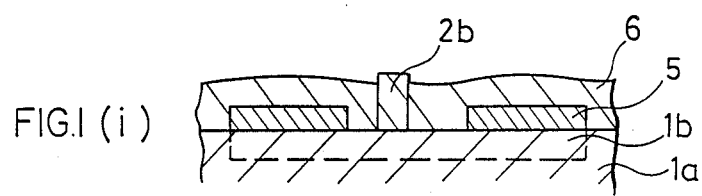
Figure 1:
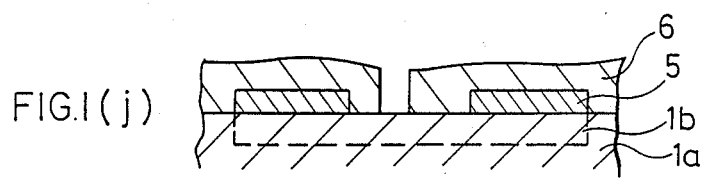
Figure 1:
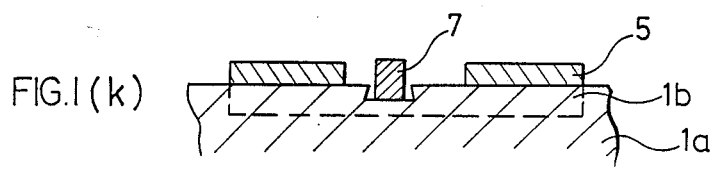
Figure 2A:
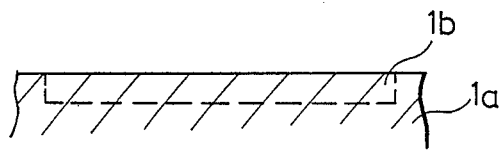
FIGS. 2(a)–2(e) are diagrams illustrating the steps in a method for producing a semiconductor device according to the prior art.
Figure 2B:
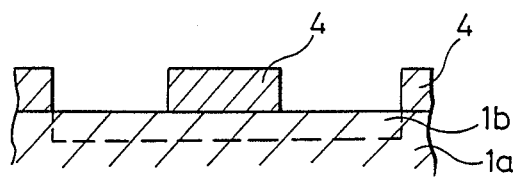
Figure 2C:
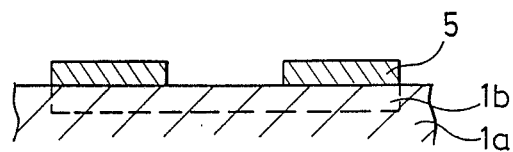
Figure 2D:
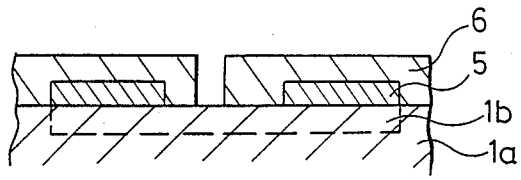
Figure 2E:
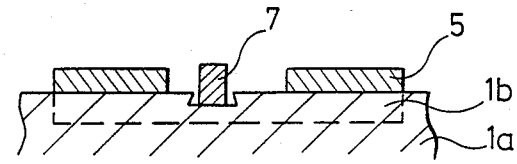

FIG. 1 is a diagram showing a production method for semiconductor device according to an embodiment of the present invention. In FIG. 1(a), an active layer 1b is disposed at the surface region of a semiconductor substrate 1a. A thin film 2 such as $Si_3N_4$, $SiO_2$ is disposed thereon. Photoresist pattern 3 is disposed on the thin film 2. Dummy electrode patterns 2a and 2b are formed from thin film 2 on the active layer 1b with pattern 3 and etching. These dummy patterns 2a and 2b determine the positions of source/drain and gate electrodes, respectively. Photoresist pattern 4 is disposed on dummy pattern 2b and substrate 1a be used as mask for replacing the source/drain dummy electrode patterns with metals for these electrodes. Source/drain electrodes 5 are disposed on the active layer 1b in place of dummy electrode patterns 2a. Photoresist pattern 6 is disposed on the source/drain electrode as a mask for replacing the gate dummy pattern with gate electrode metal. A gate electrode 7 is disposed at the recess portion of the active layer 1b. The materials of the respective electrodes are the same as those in the prior art.

The production process will be described.

A region of the semiconductor substrate 1a is activated for example by ion implantation, thereby producing an active layer 1b to a depth of about 5000 Å (FIG. 1(a)). A thin film 2 is deposited on the entire surface of the semiconductor substrate 1a including the active layer 1b to a thickness of about 5000 Å ~ 1 μm by CVD method. Next, photoresist 3 is patterned to leave portions where source/drain and gate electrodes are to be produced (FIG. 1(b)). The thin film 2 is etched with using the photoresist 3 as a mask for example by a RIE (Reactive Ion Etching) method. Thereafter the photoresist 3 is removed, thereby resulting in thin film dummy electrode patterns 2a and 2b (FIG. 1(c)).

Next, after depositing photoresist 4 thereon, the photoresist 4 is patterned by photolithography and etching to expose only the dummy patterns 2a at the source/drain electrode production regions among the thin film dummy patterns, thereby resulting in the pattern shown in FIG. 1(d). Then, the gap between the photoresist 4 and the thin film pattern 2a may be chosen to be a sufficient distance so that it causes no problems in the mask alignment step of the photolithography process.

Next, the substrate 1a is heated for about 5 minutes at a temperature of 140° to 180° C. to soften the photoresist 4 to and fill the gaps between the photoresist 4 and the dummy patterns 2a (FIG. 1(e)). Then, the dummy patterns 2a are removed, thereby resulting in the pattern shown in FIG. 1(f). Thereafter, source/drain metal is evaporated and deposited over the entire surface of partially completed device. The unwanted metal is lifted off by removal of photoresist, thereby producing source/drain electrodes 5 (FIG. 1(g)).

Next, photoresist 6 is deposited, leaving the thin film dummy pattern 2b (FIG. 1(h)) exposed. The substrate is again heated to fill the gaps between the photoresist 6 and the dummy pattern 2b, thereby resulting in the pattern shown in FIG. 1(i). Thereafter, the dummy gate pattern 2b is removed, resulting in the pattern shown in FIG. 1(j). A recess processing is formed in substrate 1a at the gate electrode production region to a depth of about 1000 Å. Gate metal is evaporated and deposited on the entire surface of the partially completed device. The unwanted metal is lifted off by removal of photoresist 6, leaving the gate electrode 7, and the pattern shown in FIG. 1(k).

In this embodiment, the dummy electrode patterns 2a and 2b are produced at the source/drain electrode production regions and the gate electrode production region, respectively, by using a mask 3. They are replaced by the source/drain electrodes 5 and the gate electrode 7 using the resist mask 4 having apertures at the source/drain electrode production region and the resist mask 6 having an aperture at the gate electrode production region, respectively. This makes it possible to prevent positional deviations due to mask alignment error and to produce source/drain electrodes and a gate electrode without variations in distances therebetween. Thus, a stable production of semiconductor device is enabled.

While in the above-illustrated embodiment, heating of substrate is adopted as a method to transform the resist patterns, a method of applying a third photoresist after producing the photoresist 4 and 6 and exposing the thin film dummy pattern by etching can be also adopted.

As is evident from the foregoing description, according to the present invention, a plurality of dummy patterns corresponding to the source/drain and gate electrodes are produced on production regions for those electrodes by using a mask, and they are replaced by those electrodes successively with using a plurality of resist patterns which have apertures at desired electrode production regions. Therefore, the positions of the source/drain and gate electrodes are determined by a mask and the electrodes can be produced at desired positions without mask alignment error.

What is claimed is:

1. A method for producing a semiconductor device including a metal pattern production process for producing a plurality of metal patterns on a semiconductor substrate having an active layer comprising:

disposing dummy metal patterns at a plurality of metal pattern production regions on a semiconductor substrate using a resist mark;

disposing on an entire surface of the substrate a resist pattern which has apertures at portions corresponding to selected metal pattern production regions, said production regions having gaps therebetween;

filling the gaps between said dummy metal patterns and said resist pattern with resist; and removing said dummy metal patterns at the selected metal pattern production regions, depositing a metal layer over the entire surface of the partially completed device, and lifting off unwanted metal, thereby producing a desired metal pattern at the selected metal pattern production regions;

said step of disposing a resist pattern and subsequent steps for replacing said dummy metal pattern with said metal pattern being performed at least twice.

2. A method for making a field effect transistor having source, drain, and gate electrodes so that the spacing from the gate electrode to the other electrodes is accurately reproduced in a plurality of field effect transistors comprising:

forming an electrically active region at a surface of a substrate;

depositing an electrically insulating layer on the surface of the substrate;

forming the electrically insulating layer, with a resist mask pattern, into portions covering regions of a substrate where (i) metal source and drain electrodes and (ii) a gate electrode are to be formed;

applying a first resist layer to the substrate and the portions;

removing the first resist layer by selective etching from only one of (i) the portion covering the gate electrode region and (ii) the portion covering the source and drain electrode region;

heating the first resist layer to fill any gaps between the first resist layer and the portion from which the first resist layer was not removed;

removing the portion not covered by the first resist layer to expose part of the surface and depositing an electrode metal on the exposed part of the surface and elsewhere on the incomplete device;

lifting off the metal from the incomplete device except from the portion from which the first resist layer was removed;

applying a second resist layer to the incomplete device and over the deposited metal;

removing the second resist layer by selective etching from the other of (i) the portion covering the gate electrode region and (ii) the portion covering the source and drain electrode region;

heating the second resist layer to fill any gaps between the second resist layer and the portion from which the second resist layer was not removed;

removing the portion not covered by the second resist layer to expose part of the surface and depositing an electrode metal on the exposed part of the surface and elsewhere on the incomplete device;

lifting off the metal from the incomplete device except from the portion from which the second resist layer was not removed.

3. The method of claim 2 wherein the portion of the first resist layer covering the source and drain electrode region is removed by selective etching.

4. The method of claim 2 wherein the portion of the first resist layer covering the gate electrode region is removed by selective etching.

5. The method of claim 2 including etching a recess in the substrate at the surface after removing the portion covering the gate electrode region and before depositing an electrode metal as the gate electrode.

6. The method of claim 2 wherein said first and second resist layers are selectively etched by reactive ion etching.

* * * * *